United States Patent
Brew et al.

(10) Patent No.: US 10,229,736 B2
(45) Date of Patent: Mar. 12, 2019

(54) MEMRISTIVE DEVICE BASED ON REVERSIBLE INTERCALATED ION TRANSFER BETWEEN TWO META-STABLE PHASES

(71) Applicant: International Business Machines Corporation, Armonk, NY (US)

(72) Inventors: Kevin W. Brew, Albany, NY (US); Talia S. Gershon, White Plains, NY (US); Seyoung Kim, White Plains, NY (US); Glenn J. Martyna, Croton on Hudson, NY (US); Dennis M. Newns, Yorktown Heights, NY (US); Teodor K. Todorov, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/630,681

(22) Filed: Jun. 22, 2017

(65) Prior Publication Data

US 2018/0374535 A1 Dec. 27, 2018

(51) Int. Cl.
  *G11C 13/04* (2006.01)
  *G11C 13/00* (2006.01)
  *H01L 45/00* (2006.01)

(52) U.S. Cl.
  CPC ...... *G11C 13/0011* (2013.01); *G11C 13/0069* (2013.01); *G11C 13/0097* (2013.01);
  (Continued)

(58) Field of Classification Search
  CPC ............ G11C 13/0069; G11C 13/0004; G11C 13/0007
  (Continued)

(56) References Cited

U.S. PATENT DOCUMENTS 7,298,017 B1    11/2007  Liu et al.
7,830,585 B2    11/2010  Widjaja et al.
(Continued)

OTHER PUBLICATIONS

Yang et al., "Memristive Devices for Computing: Mechanisms, Applications and Challenges," USLI Process Integration 8 at the 224th Electrochemical Society Meeting (Oct. 27-Nov. 1, 2013) (7 pages).

(Continued)

*Primary Examiner* — Jason Lappas
(74) *Attorney, Agent, or Firm* — Vazken Alexanian; Michael J. Chang, LLC

(57) ABSTRACT

Memristive devices based on ion-transfer between two meta-stable phases in an ion intercalated material are provided. In one aspect, a memristive device is provided. The memristive device includes: a first inert metal contact; a layer of a phase separated material disposed on the first inert metal contact, wherein the phase separated material includes interstitial ions; and a second inert metal contact disposed on the layer of the phase separated material. The first phase of the phase separated material can have a different concentration of the interstitial ions from the second phase of the phase separated material such that the first phase of the phase separated material has a different electrical conductivity from the second phase of the phase separated material. A method for operating the present memristive device is also provided.

15 Claims, 6 Drawing Sheets

(52) U.S. Cl.
CPC ........ *H01L 45/085* (2013.01); *H01L 45/1233* (2013.01); *H01L 45/1266* (2013.01); *H01L 45/147* (2013.01); *H01L 45/1608* (2013.01); *G11C 13/04* (2013.01); *G11C 2013/009* (2013.01); *G11C 2213/13* (2013.01); *G11C 2213/31* (2013.01)

(58) Field of Classification Search
USPC .......................................................... 365/148
See application file for complete search history.

(56) References Cited

U.S. PATENT DOCUMENTS

| | | | |
|---|---|---|---|
| 7,846,807 | B2 | 12/2010 | Tang et al. |
| 8,063,395 | B2 * | 11/2011 | Xia ...................... H01L 45/145 257/4 |
| 8,093,575 | B2 * | 1/2012 | Xia ...................... H01L 27/101 257/2 |
| 9,583,704 | B2 * | 2/2017 | You ......................... H01L 45/08 |
| 2009/0297841 | A1 | 12/2009 | Sasaoka et al. |
| 2010/0155686 | A1 | 6/2010 | Bratkovski et al. |
| 2011/0228593 | A1 | 9/2011 | Strukov |
| 2011/0240941 | A1 | 10/2011 | Pickett et al. |
| 2011/0248381 | A1 | 10/2011 | Tong et al. |
| 2012/0313070 | A1 | 12/2012 | Williams et al. |
| 2015/0170025 | A1 | 6/2015 | Wu et al. |
| 2016/0126587 | A1 | 5/2016 | Ni et al. |

OTHER PUBLICATIONS

Tsai et al., "Atomic Structure and Ab Initio Electrochemical Properties of Li4Ti5O12 Defect Spinel for Li Batteries," Journal of the Electrochemical Society, 161 (3) A439-A444 (Jan. 2014).

Anton Van der Ven et al., "Understanding Li Diffusion in Li-Intercalation Compounds," Acc. Chem. Res., 2013, 46(5), pp. 1216-1225 (May 2012).

Li et al., "Two-phase transition of Li-intercalation compounds in Li-ion batteries," Materials Today, vol. 17, No. 9, pp. 451-463 (Nov. 2014).

J.D. Greenlee et al., "In-situ oxygen x-ray absorption spectroscopy investigation of the resistance modulation mechanism in LiNbO2 memristors," Applied Physics Letters, vol. 100, No. 18, May 2012, 182106, 4 pages.

J.D. Greenlee et al., "Halide based MBE of crystalline metals and oxides," physica status solidi (c), vol. 9, No. 2, 2012, pp. 155-160 (published Dec. 2011).

J.D. Greenlee et al., "Spatiotemporal drift-diffusion simulations of analog ionic memristors," Journal of Applied Physics, vol. 114, No. 3, Jul. 2013, 034504, 9 pages.

J. Shi et al., "Colossal resistance switching and band gap modulation in a perovskite nickelate by electron doping," Nature Communications, vol. 5, Sep. 2014, 9 pages.

V.H. Mai et al., "Memristive and neuromorphic behavior in a LixCoO2 nanobattery," Scientific Reports, vol. 5, Jan. 2015, 6 pages.

E.J. Fuller et al., "Scanning Probe Characterization of Memristors Based on a Li Intercalation Metal Oxide," The Electrochemical Society, 229th ECS Meeting, 2016, Abstract No. 22, p. 1159.

* cited by examiner

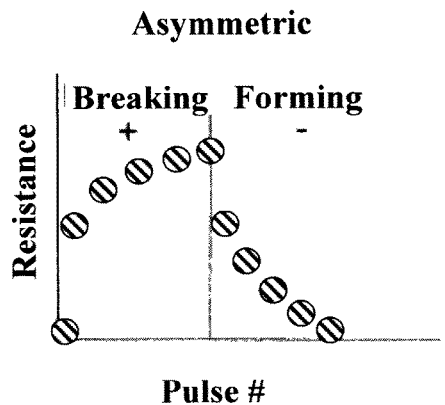 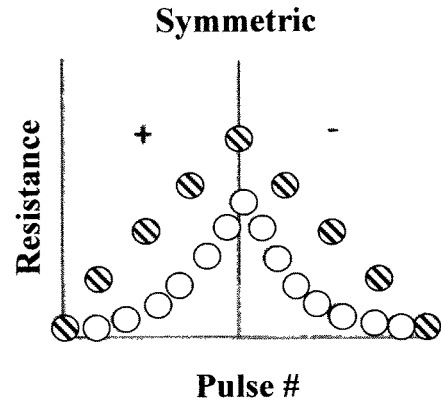
FIG. 1A   FIG. 1B
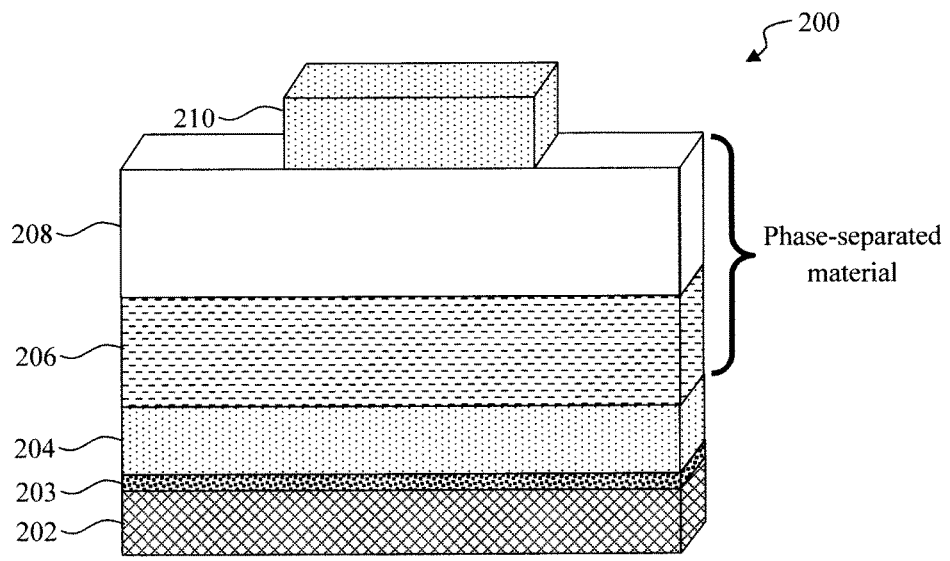
FIG. 2

MEMRISTIVE DEVICE BASED ON REVERSIBLE INTERCALATED ION TRANSFER BETWEEN TWO META-STABLE PHASES

FIELD OF THE INVENTION

The present invention relates to memristive devices and more particularly, to memristive devices based on reversible ion transfer between two meta-stable phases of differing conductivities in an ion intercalated material.

BACKGROUND OF THE INVENTION

Memristive devices are electrical switches that can alter their state of internal resistance based on an applied voltage and current. See, for example, Yang et al., "Memristive Devices for Computing: Mechanisms, Applications and Challenges," USLI Process Integration 8 at the $224^{th}$ Electrochemical Society Meeting (Oct. 27-Nov. 1, 2013) (7 pages). Memristive devices have gained significant interest for accelerated machine learning applications.

Memristive devices need to have the following characteristics. Memristive devices have to be non-volatile and capable of storing a variable resistance value. This resistance can be tuned up and down using current or voltage pulses. Memristive device resistance needs to be symmetrically tunable, meaning that when positive (+) or negative (−) voltage pulses are applied to the device, the resistance moves up or down by roughly the same magnitude.

Current nanoionic memristor devices (e.g., resistive random-access memory (RRAM), conductive bridging random access memory (CBRAM), etc.) however do not show symmetric modulation between stored resistance states. This asymmetry precludes as is current technologies for use in the implementation of the resistive processing unit (RPU) for accelerated machine learning which involves performing a large number of computations in parallel.

Therefore, techniques for achieving symmetric modulation of resistances in a memristive device would be desirable.

SUMMARY OF THE INVENTION

The present invention provides memristive devices based on alkali-transfer between two meta-stable phases in an ion intercalated material. In one aspect of the invention, a memristive device is provided. The memristive device includes: a first inert metal contact; a layer of a phase separated material disposed on the first inert metal contact, wherein the phase separated material includes interstitial ions; and a second inert metal contact disposed on the layer of the phase separated material. The first phase of the phase separated material can have a different concentration of the interstitial ions from the second phase of the phase separated material such that the first phase of the phase separated material has a different electrical conductivity from the second phase of the phase separated material.

In another aspect of the invention, a method of operating a memristive device is provided. The method includes: providing the memristive device having a first inert metal contact; a layer of a phase separated material disposed on the first inert metal contact, wherein the phase separated material includes interstitial ions, and a second inert metal contact disposed on the layer of the phase separated material, wherein a first phase of the phase separated material is a cathode of the memristive device, and a second phase of the phase separated material is an anode of the memristive device; applying a positive voltage pulse to the first inert metal contact to transfer some of the interstitial ions from the cathode to the anode; and applying a negative voltage pulse to the first inert metal contact to return the transferred interstitial ions back to the cathode.

A more complete understanding of the present invention, as well as further features and advantages of the present invention, will be obtained by reference to the following detailed description and drawings.

BRIEF DESCRIPTION OF THE DRAWINGS

FIG. 1A is a schematic diagram illustrating asymmetric device resistance modulation;

FIG. 1B is a schematic diagram illustrating symmetric device resistance modulation according to an embodiment of the present invention;

FIG. 2 is a diagram illustrating an exemplary memristive device according to an embodiment of the present invention;

DETAILED DESCRIPTION OF PREFERRED EMBODIMENTS

Figure 3:
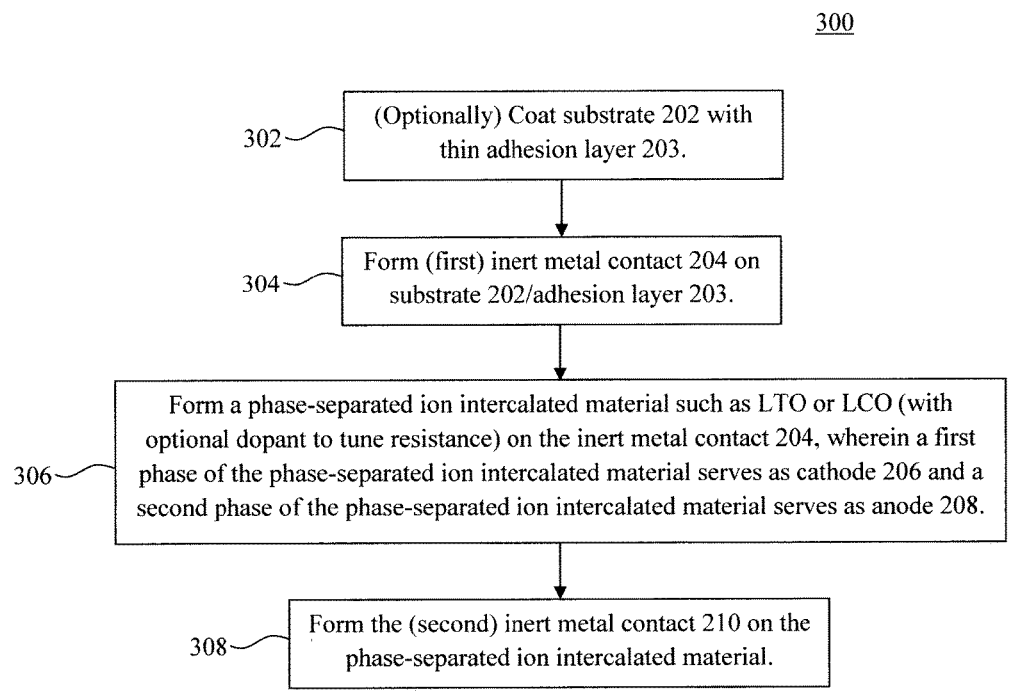
FIG. 3 is a diagram illustrating an exemplary methodology for forming the present memristive device according to an embodiment of the present invention.

Provided herein is a bipolar, analog memristive device that enables symmetric switching between a multitude of resistance states. As provided above, device resistance must be symmetrically modulated, e.g., when provided n positive pulses, n negative pulses returns the device to the same resistance. Current nanoionics (e.g., RRAM, CBRAM, etc.) do not show symmetric modulation of resistance due to their principles of operation, which consist of forming and breaking a conductive filament of material within the device. See, for example, FIGS. 1A and 1B which illustrate asymmetric and symmetric modulation of resistance, respectively, as a function of pulse number (#). Further, as shown in the two examples presented in FIG. 1B, the potentiation/depotentiation paths do not have to be linear (i.e., one path shown in FIG. 1B is linear and the other is not), however they need to be symmetric.

In order to achieve symmetric modulation between resistance states, an alternative to filamentary based memristive devices is proposed herein, where phase separation is used to achieve constant $\mu_{Li+}$ (chemical potential of lithium (Li) or other intercalated ions) in each phase, and thus reversible modulation of lithium (or other intercalated ions) between phases. Specifically, in the present memristive device a phase-separated material with interstitial ions (i.e., a two-phase material) is placed between electrically conductive, inert electrodes. The phase separated material has two phases, each phase having a different concentration of the interstitial ions and hence a different electrical conductivity. Specifically, the two-phase material has an electrically conductive phase, and the second phase that is (electrically) insulating but becomes electrically conductive upon adding (intercalating) the ions (see, for example, FIGS. 6 and 7, described below). Physics allows transfer of ions between these two meta-stable phases up to the stability limit (second derivative of Gibb's free energy), thus increasing or decreasing the resistance of the device. The extent of non-volatility is determined by the kinetics of ion diffusion and the Coulombic repulsive forces between mobile ions. Symmetric switching is achieved because in a phase-separation material, the chemical potential of lithium ions ($Li^+$) (or other intercalated ions) is equal in both phases and so transfer to and fro is reversible.

An exemplary configuration of the present memristive device is shown in FIG. 2. As shown in FIG. 2, memristive device 200 includes a substrate 202 on which a first inert metal contact 204 is disposed. Suitable substrates include, but are not limited to, glass (e.g., soda lime glass (SLG)), ceramic, metal foil, or plastic substrates. According to an exemplary embodiment, the substrate is first coated with a thin adhesion layer 203 to aid in deposition of the inert metal contact 204 onto the substrate 202. By way of example only, the adhesion layer 203 is formed having a thickness of from about 1 nanometer (nm) to about 5 nm, and ranges therebetween. Suitable materials for the adhesion layer 203 include, but are not limited to, chromium (Cr), titanium (Ti), and/or nickel (Ni).

Suitable materials for the inert metal contact 204 include, but are not limited to, ruthenium (Ru), rhodium (Rh), palladium (Pd), silver (Ag), gold (Au) and/or platinum (Pt). By 'inert' it is meant that the metal is unreactive under normal operating conditions and blocks ion transport.

A phase separated material is disposed on the inert metal contact 204. As described above, the phase separated material includes two phases. One of the phases serves as a cathode 206 and another of the phases serves as an anode 208 of the memristive device. As such, according to an exemplary embodiment, the cathode 206 and anode 208 contain different phases (i.e., Phase 1 and Phase 2, respectively) of the phase separated intercalated material, i.e., the cathode 206 and anode 208 are formed from disproportionate mixtures of a common material (e.g., lithium titanium oxide (LTO), lithium cobalt oxide (LCO), etc.—see below) having different concentrations of lithium (Li) interstitial ions.

Using Li as an example, a suitable ion intercalated material is lithium (Li) titanium (Ti) oxide or LTO. The LTO spinel can exist in two phases, $Li_4Ti_5O_{12}$ and $Li_7Ti_5O_{12}$. During Li intercalation into the $Li_4Ti_5O_{12}$ spinel, rearrangement of Li ions occurs filling different sites in the sub-lattices, forming $Li_7Ti_5O_{12}$. See, for example, Tsai et al., "Atomic Structure and Ab Initio Electrochemical Properties of $Li_4Ti_5O_{12}$ Defect Spinel for Li Batteries," Journal of the Electrochemical Society, 161 (3) A439-A444 (January 2014), the contents of which are incorporated by reference as if fully set forth herein. Another suitable ion intercalated material is lithium cobalt (Co) oxide or LCO. The LCO spinel can exist in two phases, $Li_{0.74}CoO_2$ and $Li_{0.95}CoO_2$. Like with LTO, during Li intercalation into the $Li_{0.74}CoO_2$ spinel, rearrangement of Li ions occurs filling different sites in the sub-lattices, forming $Li_{0.95}CoO_2$.

As will be described in detail below, Li ion intercalation occurs by applying electric pulses to the device to transfer interstitial Li ions between the two phases. Li intercalation involves phase transformations. See, for example, Anton Van der Ven et al., "Understanding Li Diffusion in Li-Intercalation Compounds," Acc. Chem. Res., 2013, 46(5), pp. 1216-1225 (May 2012), the contents of which are incorporated by reference as if fully set for the herein. Accordingly, the cathode 206 and anode 208 in the present device structure can be phase-separated from one another. According to one exemplary embodiment, the device is constructed with $Li_7Ti_5O_{12}$ or $Li_{0.95}CoO_2$ as the cathode 206 and $Li_4Ti_5O_{12}$ or $Li_{0.74}CoO_2$ as the anode 208. However, the cathode and anode are in practice interchangeable as this is a zero-volt battery structure. Thus, according to an exemplary embodiment, the cathode 206 includes LTO or LCO having the formula $Li_4Ti_5O_{12}$ or $Li_{0.74}CoO_2$, and the anode 208 includes LTO or LCO having the formula $Li_7Ti_5O_{12}$ or $Li_{0.95}CoO_2$.

Optionally, the cathode 206 and/or the anode 208 can be doped with a transition metal to tune the resistance. Suitable transition metal dopants include, but are not limited to nickel (Ni), tungsten (W), iron (Fe), and/or tantalum (Ta). Doping the cathode 206 and/or anode 208 with a transition metal can be used to ensure that either the anode or cathode is consistently conductive to electrons. For instance, Li ion diffusion out of a phase into the other phase disproportionately affects conductivity of each phase. It is desirable for the overall phase-separation material to remain somewhat conductive to electrons (<gigaohms (GOhm)) during operation so that memristive properties are apparent over capacitive effects. Thus, employing non-diffusing dopants (such as transition metal ions) to tune the base resistance can insure that both the anode and cathode are of appropriate resistances. For instance, the $Li_4Ti_5O_{12}$ may be doped with a transition metal M to make it more conductive, for example, $Li_4Ti_{5-x}M_xO_{12}$, wherein x is 0-0.3, e.g., x=0.1. The notion here is that there are two phases, one electrically conductive and one electrically insulating. The overall resistance across the two layers is a combination of the two resistances. If this base resistance is too high (>10^9 ohms), the device will act as a capacitor with a high RC time constant which prevents an accurate read on the device. Hence, resistance tuning via transition metal doping can be implemented.

A second inert metal contact 210 is disposed on the phase-separated material. Suitable materials for the inert metal contact 210 include, but are not limited to, Ru, Rh, Pd, Ag, Au and/or Pt, same as for the inert metal contact 204. In fact, it is preferable that the inert metal contact 204 and the inert metal contact 210 are formed from the same material or combination of materials to insure symmetric Ohmic behavior in reverse and forward bias. However, as shown in FIG. 2, the inert metal contact 204 and the inert metal contact 210 do not have to have the same shape/dimensions as one another. For instance, in the example depicted, the inert metal contact 210 covers only a portion of the top of the phase-separated material, while a complete layer of the inert metal contact 204 covers the substrate 202 beneath the phase-separated material. For practical reasons, since the device is built sequentially from the bottom up (see below), each layer provides structural support for the immediately preceding layer in the stack. Engineering, e.g., the inert metal contact 210, to be smaller in size than the underlying layers, enables convenient access to the underlying anode 208, cathode 206, and inert metal contact 204, etc. during operation.

FIG. 3 is a diagram illustrating an exemplary methodology 300 for forming the present memristive device 200. In step 302, the thin adhesion layer 203 is coated on the substrate 202. Suitable substrate and adhesion layer materials were provided above. As also provided above, the adhesion layer 203 is formed as a coating on the substrate 202 having a thickness of from about 1 nm to about 5 nm, and ranges therebetween. The adhesion layer 203 can be formed on the substrate using a process such as evaporation or sputtering. While an optional feature, the adhesion layer 203 serves as a nucleation center and thus aids in deposition of the inert metal contact 204 onto the substrate 202.

In step 304, the (first) inert metal contact 204 is formed on the substrate 202 (e.g., on the optional adhesion layer 203). Suitable materials for the inert metal contacts were provided above. The inert metal contact 204 can be formed on the substrate 202 using a process such as evaporation, sputtering, or electrochemical deposition (which is enabled by use of the optional adhesion layer 203).

In step 306, a layer of a phase-separated ion intercalated material is next formed on the inert metal contact 204. As provided above, the phase-separated ion intercalated material is a single layer that includes two distinct phases of the material, one of which will serve as the cathode 206, and the other which will serve as the anode 208 of the memristive device. For instance, the cathode/anode layer of phase-separated ion intercalated material formed in step 306 can include, for example, $Li_7Ti_5O_{12}/Li_4Ti_5O_{12}$ or $Li_{0.74}CoO_2/Li_{0.95}CoO_2$, respectively. Thus, the phase-separated ion intercalated material is formed as a single layer having two phases, one serving as the cathode and the other as the anode of the device.

According to an exemplary embodiment, the phase-separated ion intercalated material is formed by depositing a single layer at one stoichiometry and then either adding or removing lithium to the layer to push the stoichiometry into the miscibility gap (i.e., where the mixture exists as two phases). This mixture is unstable and will phase separate into two compositions within the layer.

For instance, the lower lithium concentration LTO phase (i.e., $Li_4Ti_5O_{12}$) can be deposited as a layer on the inert metal contact 204 followed by lithiation to add lithium to the layer, whereby the material phase separates into two phases, one being (electrically) conducting and the other (electrically) insulating. For example, in the case of anodic $Li_4Ti_5O_{12}/Li_7Ti_5O_{12}$ the lower concentration $Li_4Ti_5O_{12}$ can be made via solution or physical vapor deposition (PVD) methods. Then the high concentration (i.e., $Li_7Ti_5O_{12}$) is created by chemical lithiation with n-butyllithium which works for any materials with above ~1 volt (V) Li+/Li relative potential.

Lithium may also be added by electrochemical lithiation where, for example, the memristive device (i.e., substrate 202/inert metal contact 204/LTO or LCO) is submerged in a liquid electrolyte along with a lithium-containing electrode. A bias voltage is applied to the device (e.g., via the inert metal contact 204) and the lithium-containing electrode to drive Li ions from the lithium-containing electrode into the LTO or LCO. Following lithiation, the device is removed from the liquid electrolyte and dried. Suitable liquid electrolytes include, but are not limited to, lithium hexafluorophosphate ($LiPF_6$) in ethylene carbonate. Suitable lithium-containing electrodes include, but are not limited to, a lithium cobalt oxide ($LiCoO_2$) electrode.

In the case of cathodic $LiCoO_2$ the high concentration LCO phase (i.e., $Li_{0.95}CoO_2$) can be made via solution or PVD methods as a layer on the inert metal contact 204. Then the low concentration phase (i.e., $Li_{0.74}CoO_2$) is created in that layer by chemical delithiation via warm (e.g., at a temperature of from about 50° C. to about 120° C., and ranges therebetween) aqueous $K_2S_2O_8$ (potassium persulfate) solution (e.g., for a duration of from about 1 hour to about 30 hours, and ranges therebetween depending on desired thickness). Chemical delithiation may also be done with dilute hydrochloric acid etching or hydrogen peroxide.

For a solution-based deposition process, the constituent components of the respective phase-separated ion intercalated material (such as lithium hydroxide and titanium dioxide for LTO or lithium hydroxide and cobalt oxide for LCO) are mixed at the given Li/Ti or Li/Co molar ratios (e.g., to form the lower concentration $Li_4Ti_5O_{12}$ or the higher concentration LCO phase (i.e., $Li_{0.95}CoO_2$)—see above) in a suitable solvent (such as ethanol or water) to form a solution. Optionally, as provided above, transition metal dopants can be incorporated into the solution to tune the cathode/anode resistance. The solution can then be cast (e.g., using spin-coating, spray-coating, ink jet printing, etc.) onto the inert metal contact 204 and permitted to dry. Delithiation or lithiation is then performed as described above in order to obtain a phase-separated material, e.g., $Li_7Ti_5O_{12}/Li_4Ti_5O_{12}$ or $Li_{0.74}CoO_2/Li_{0.95}CoO_2$, serving as the cathode/anode, respectively.

Following delithiation or lithiation, an anneal is then performed. Suitable annealing conditions include, but are not limited to, a temperature of from about 500° C. to about 1,500° C., and ranges therebetween, for a duration of from about 5 hours to about 30 hour, and ranges therebetween.

With PVD, deposition is carried out in a vacuum chamber in which the device is placed along with appropriate sources of the LTO or LCO material (and optional transition metal dopant) in the appropriate ratios. Following PVD, delithiation or lithiation, is carried out as described above, followed by the anneal using the above-described conditions.

As described above, an optional transition metal dopant can be added to the cathode 206 and/or anode 208 to tune the resistance. Suitable transition metal dopants were provided above. This doping can be accomplished by incorporating the dopant into the starting solution, prior to casting.

The layer of a phase-separated ion intercalated material formed as per step 306 produces a cathode 206 (i.e., as a first phase of the phase-separated ion intercalated material) and an anode 208 (i.e., as a second phase of the phase-separated ion intercalated material) on the inert metal contact 204. In step 308, the (second) inert metal contact 210 is formed on the phase-separated ion intercalated material. Suitable materials for the inert metal contacts were provided above, and the inert metal contact 210 may be formed in the same manner as described above for forming the inert metal contact 204. As previously noted, it is preferable that the inert metal contact 204 and the inert metal contact 210 are formed from the same material or combination of materials to insure symmetric Ohmic behavior in reverse and forward bias.

Figure 4:
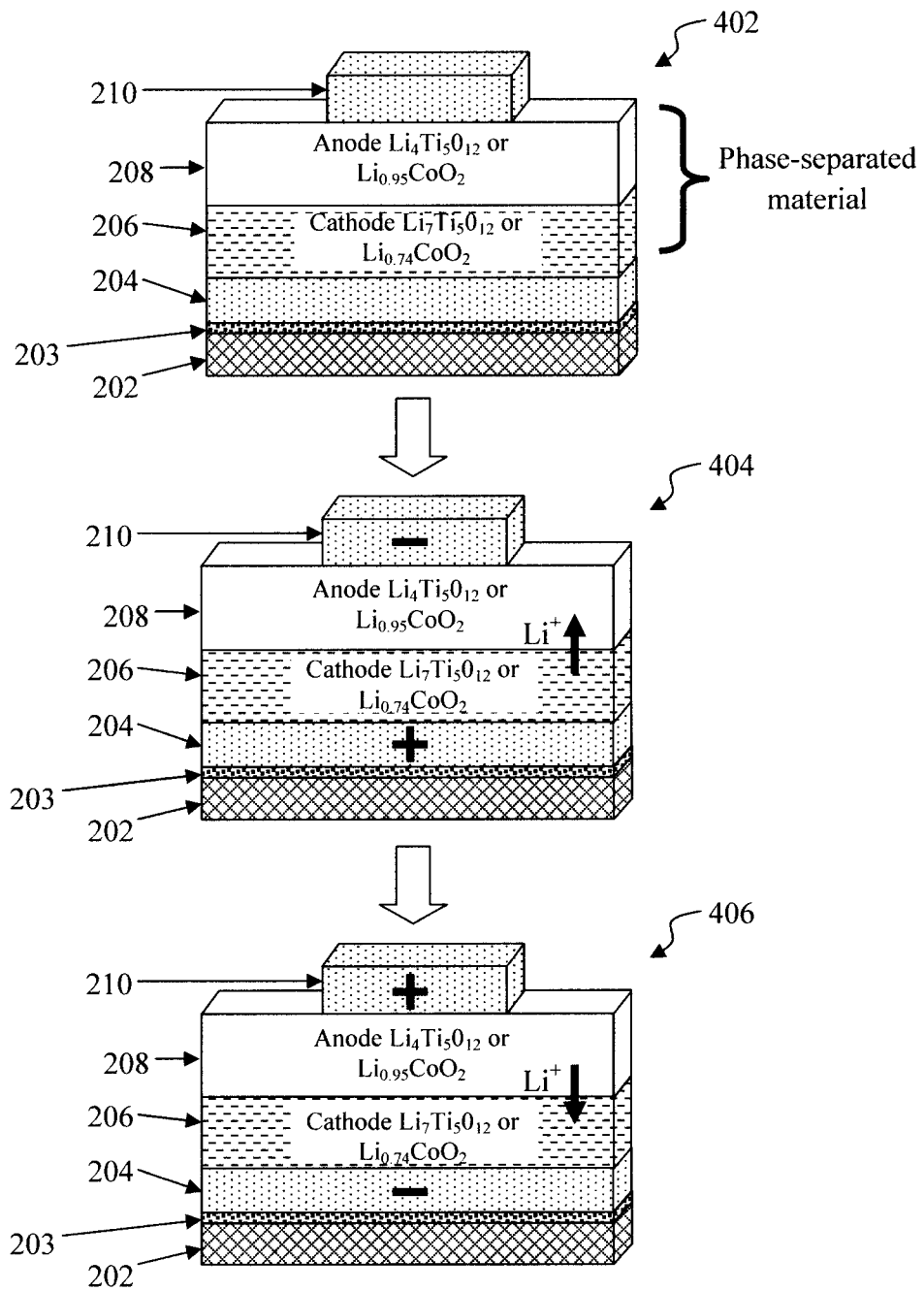
FIG. 4 is a diagram illustrating an exemplary methodology for operating the present memristive device according to an embodiment of the present invention.

An exemplary methodology 400 for operating the present memristive device 200 is now described by way of reference to FIG. 4. The following description uses a phase separated ion intercalated material layer that includes $Li_7Ti_5O_{12}/Li_4Ti_5O_{12}$ or $Li_{0.74}CoO_2/Li_{0.95}CoO_2$ as examples. The present teachings, however, are not limited to LTO, LCO or any other particular configuration, as long as the cathode 206 and anode 208 include a phase separated ion intercalated material.

In step 402, with no applied voltage memristive device 200 is present in its as-fabricated state described above. Specifically, in this particular example, the cathode 206 and anode 208 include $Li_7Ti_5O_{12}$ and $Li_4Ti_5O_{12}$, or $Li_{0.74}CoO_2$ and $Li_{0.95}CoO_2$, respectively.

As shown in step 404, a first (positive) pulse is applied to the (first) inert metal contact 204. This first pulse serves to transfer some lithium ions ($Li^+$) from the cathode 206 to the anode 208. As a result of this Li intercalation into the anode 208 (from the cathode 206), a resistance across the device changes.

Reversing the pulse reverses the flow of lithium ions back towards the cathode 206. See step 406. As shown in step 406, applying a second (negative) pulse to the (first) inert metal contact 204 serves to return the transferred lithium ions ($Li^+$) from the anode 208 back to the cathode 206, restoring the resistance back to its original state (prior to application of the first pulse). The first (positive) and second (negative) pulses are of the same duration and magnitude.

The resistance state of the memristive device would be "read" by applying a much smaller voltage pulse than is needed for Li intercalation (e.g., less than 0.5 volts (V)) and measuring the current. Higher current measurements at the lower-voltage "read" condition would correspond to a lower resistance state, and vice versa.

Figure 5:
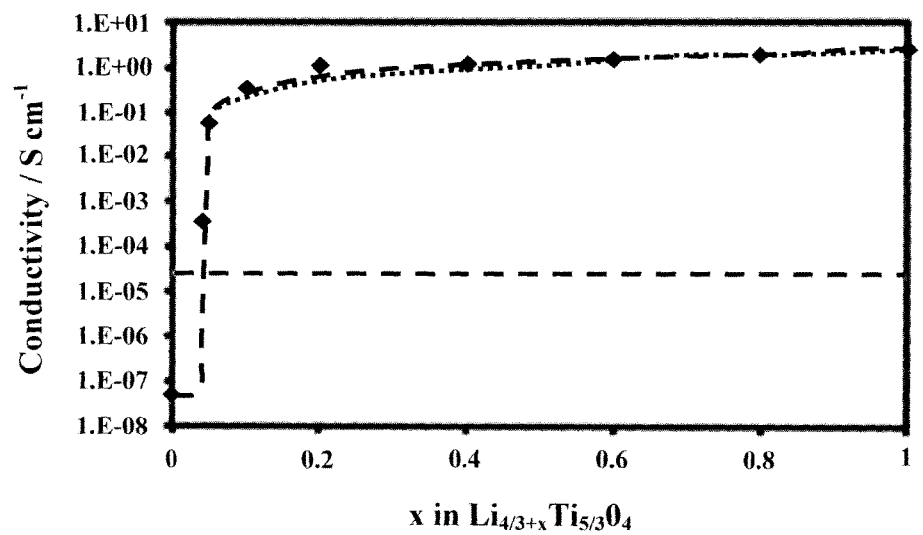
FIG. 5 is a diagram illustrating how lithium titanium oxide (LTO) resistance can be modulated through the introduction of conduction band electrons from lithium ions (Li+) according to an embodiment of the present invention.

FIG. 5 is a diagram illustrating how LTO resistance can be modulated through the introduction of conduction band electrons (e−) from Li+. Specifically, as shown in FIG. 5, conductivity (measured in Siemens per centimeter (S cm$^{-1}$)) increases with an increase in intercalated Li ions. With LTO, $Ti^{4+}$ is reduced to $Ti^{3+}$ with $Li^+$ intercalation, introducing conduction band electrons. FIG. 5 also illustrates that there is a non-linear dependence of resistance on composition.

As provided above, the ion-intercalated layer is phase separated, e.g., into a cathode and anode. For an illustration of an LTO sample separated into an $Li_7Ti_5O_{12}$ phase and an $Li_4Ti_5O_{12}$ phase see, for example, FIG. 9(b) of Li et al., "Two-phase transition of Li-intercalation compounds in Li-ion batteries," Materials Today, vol. 17, no. 9, pgs. 451-463 (November 2014), the contents of which are incorporated by reference as if fully set forth herein. Li ions can be moved back and forth between the phases using a voltage potential. As long as the same potential is used (i.e., same duration and magnitude—see above), Li intercalation between the phases will be symmetric and reversible.

Figure 6:
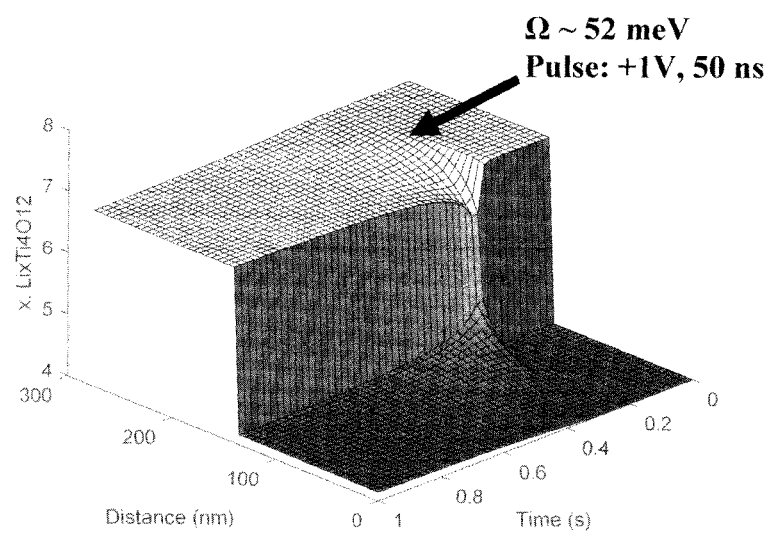
FIG. 6 is a diagram illustrating phase separation in an LTO material in terms of Li concentration x as a function of both distance and time according to an embodiment of the present invention.
Figure 7:
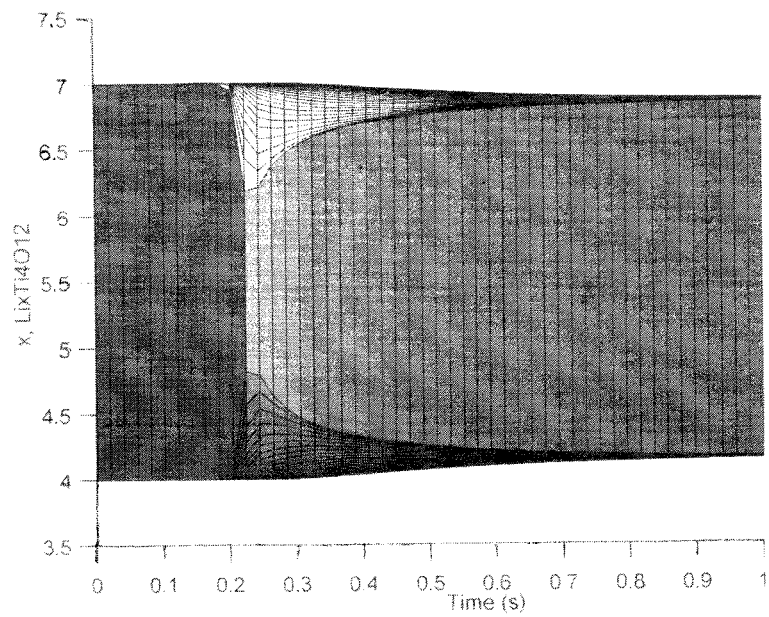
FIG. 7 is a diagram illustrating the phase separation in an LTO material in terms of Li concentration x as a function of time according to an embodiment of the present invention.

A phase separation simulation for an LTO material is shown in FIGS. 6 and 7. Referring first to FIG. 6, it can be seen that a positive voltage pulse (in this case a +1 volt (V) pulse for 50 nanoseconds (ns)) transfers Li+ions from the higher Li+ ion phase (i.e., the Li-LTO phase) to the lower Li+ ion phase (i.e., the LTO phase). FIG. 6 provides a three-dimensional projection wherein Li concentration x is illustrated as a function of both distance (measured in nanometers (nm)) and time (measured in seconds (s)). FIG. 7 projects in two dimensions Li concentration x as a function of time. The LTO phase with higher Li+ concentration is now conductive, and the Li-LTO phase remains conductive. As a result, the net conductivity across the device increases. Resistance is Ω~52 meV.

Figure 8:
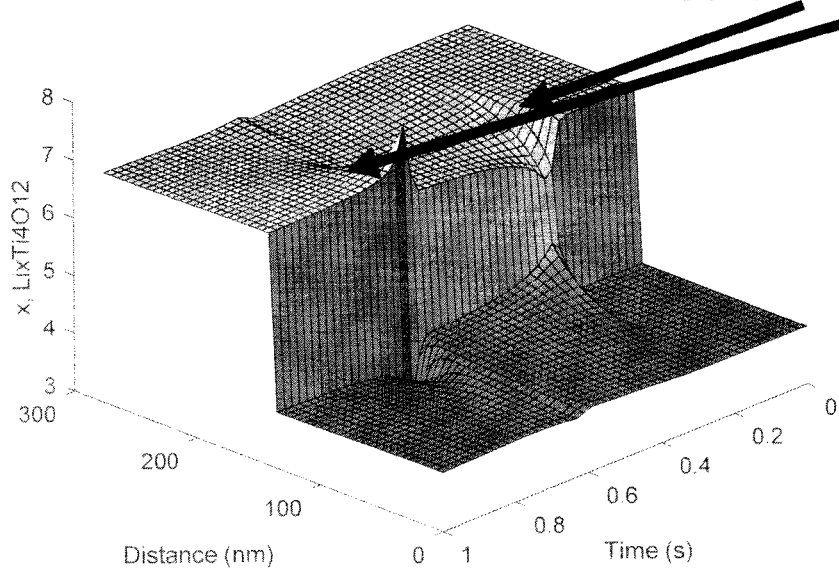
FIG. 8 is a diagram illustrating symmetric transfer of Li+ions between the phases in terms of Li concentration x as a function of both distance and time according to an embodiment of the present invention.
Figure 9:
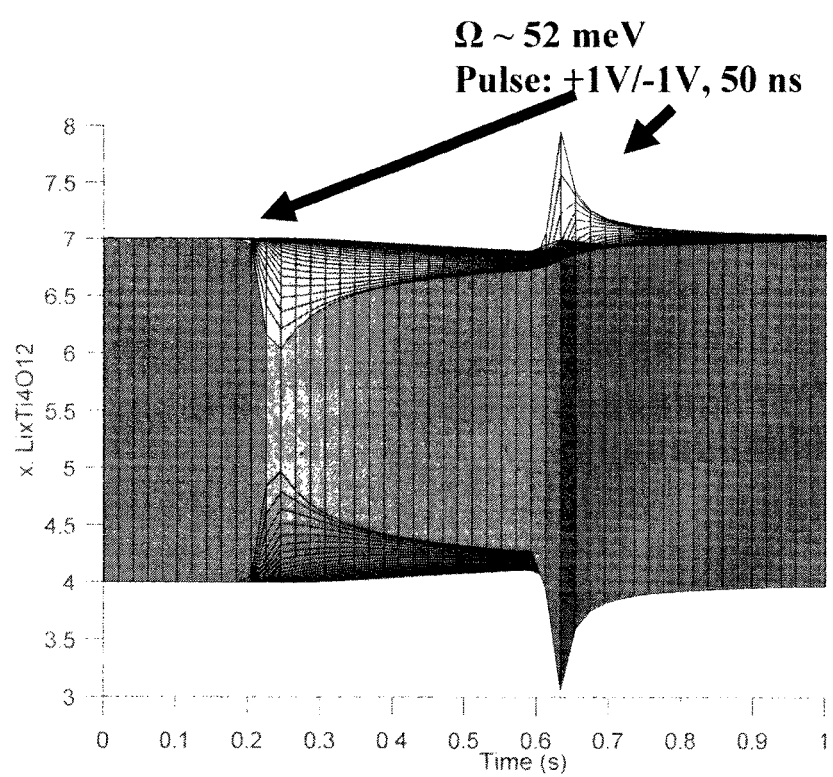
FIG. 9 is a diagram illustrating symmetric transfer of Li+ions between the phases in terms of Li concentration x as a function of time according to an embodiment of the present invention.

As highlighted above, an important characteristic of the present memristive devices is symmetric transfer of Li+ions between the phases. As shown in FIGS. 8 and 9, a first positive pulse (in this case a +1V pulse for 50 ns) transfers some Li+ions and the second negative pulse of the same duration and magnitude (i.e., a −1V pulse for 50 ns) transfers the Li+ions back. Thus, the phases can be reversibly changed back to their original state. FIG. 8 provides a three-dimensional projection wherein Li concentration x is illustrated as a function of both distance (measured in nm) and time (measured in s). FIG. 9 projects in two dimensions Li concentration x as a function of time.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A memristive device, comprising:
a first inert metal contact;
a layer of a phase separated material disposed on the first inert metal contact, wherein the phase separated material comprises interstitial ions, wherein a first phase of the phase separated material is a cathode of the memristive device, wherein a second phase of the phase separated material is an anode of the memristive device, wherein the first phase of the phase separated material comprises a different concentration of the interstitial ions from the second phase of the phase separated material such that the first phase of the phase separated material has a different electrical conductivity from the second phase of the phase separated material, and wherein the phase separated material is selected from the group consisting of: lithium titanium oxide, and lithium cobalt oxide; and
a second inert metal contact disposed on the layer of the phase separated material.

2. The memristive device of claim 1, wherein the interstitial ions comprise lithium ions.

3. The memristive device of claim 1, wherein the first phase of the phase separated material comprises lithium titanium oxide having a formula $Li_7Ti_5O_{12}$, and wherein the second phase of the phase separated material comprises lithium titanium oxide having a formula $Li_4Ti_5O_{12}$.

4. The memristive device of claim 1, wherein the first phase of the phase separated material comprises lithium cobalt oxide having a formula $Li_{0.74}CoO_2$, and wherein the second phase of the phase separated material comprises lithium cobalt oxide having a formula $Li_{0.95}CoO_2$.

5. The memristive device of claim 1, wherein at least one of the first phase of the phase separated material and the second phase of the phase separated material is doped with a transition metal selected from the group consisting of: nickel, tungsten, iron, tantalum, and combinations thereof.

6. The memristive device of claim 1, wherein the first inert metal contact and the second inert metal contact are each formed from a metal selected from the group consisting of: ruthenium, rhodium, palladium, silver, gold, platinum, and combinations thereof.

7. The memristive device of claim 6, wherein the first inert metal contact and the second inert metal contact are formed from a same metal as one another.

8. The memristive device of claim 1, further comprising:
a substrate; and
an adhesion layer coating the substrate, wherein the first inert metal contact is disposed on the adhesion layer.

9. The memristive device of claim 8, wherein the adhesion layer comprises a material selected from the group consisting of: chromium, titanium, nickel, and combinations thereof.

10. The memristive device of claim 8, wherein the adhesion layer has a thickness of from about 1 nm to about 5 nm, and ranges therebetween.

11. A method of operating a memristive device, the method comprising:
providing the memristive device having a first inert metal contact; a layer of a phase separated material disposed on the first inert metal contact, wherein the phase separated material comprises interstitial ions, and a second inert metal contact disposed on the layer of the phase separated material, wherein a first phase of the phase separated material is a cathode of the memristive device, and a second phase of the phase separated material is an anode of the memristive device, wherein the first phase of the phase separated material comprises lithium titanium oxide having a formula $Li_7Ti_5O_{12}$, and wherein the second phase of the phase separated material comprises lithium titanium oxide having a formula $Li_4Ti_5O_{12}$;
applying a positive voltage pulse to the first inert metal contact to transfer some of the interstitial ions from the cathode to the anode; and
applying a negative voltage pulse to the first inert metal contact to return the transferred interstitial ions back to the cathode.

12. The method of claim 11, wherein the positive voltage pulse and the negative voltage pulse have a same magnitude and duration as one another.

13. The method of claim 11, wherein the first phase of the phase separated material comprises a different concentration of the interstitial ions from the second phase of the phase separated material such that the first phase of the phase separated material has a different electrical conductivity from the second phase of the phase separated material.

14. The method of claim 11, wherein at least one of the first phase of the phase separated material and the second phase of the phase separated material is doped with a transition metal selected from the group consisting of: nickel, tungsten, iron, tantalum, and combinations thereof.

15. The method of claim 11, wherein the first inert metal contact and the second inert metal contact are formed from a same metal as one another selected from the group consisting of: ruthenium, rhodium, palladium, silver, gold, platinum, and combinations thereof.

* * * * *